(12) United States Patent
Wang

(10) Patent No.: US 10,923,559 B2
(45) Date of Patent: Feb. 16, 2021

(54) DISPLAY PANEL OF PORTABLE ELECTRONIC DEVICE AND DESIGN METHOD THEREFOR

(71) Applicant: Galaxycore Shanghai Limited Corporation, Shanghai (CN)

(72) Inventor: Fuzhong Wang, Shanghai (CN)

(73) Assignee: Galaxycore Shanghai Limited Corporation, Shanghai (CN)

( * ) Notice: Subject to any disclaimer, the term of this patent is extended or adjusted under 35 U.S.C. 154(b) by 0 days.

(21) Appl. No.: 16/982,389

(22) PCT Filed: Oct. 15, 2019

(86) PCT No.: PCT/CN2019/111153
§ 371 (c)(1),
(2) Date: Sep. 18, 2020

(87) PCT Pub. No.: WO2020/151265
PCT Pub. Date: Jul. 30, 2020

(65) Prior Publication Data
US 2021/0005703 A1    Jan. 7, 2021

(30) Foreign Application Priority Data

Jan. 25, 2019 (CN) .......................... 201910071149.1

(51) Int. Cl.
*H01L 27/32* (2006.01)
*H01L 51/56* (2006.01)
(Continued)

(52) U.S. Cl.
CPC ....... *H01L 27/3276* (2013.01); *G09G 3/3225* (2013.01); *H01L 27/322* (2013.01);
(Continued)

(58) Field of Classification Search
CPC .................................................. H01L 27/3276
See application file for complete search history.

(56) References Cited

U.S. PATENT DOCUMENTS

2008/0129716 A1    6/2008  Li
2018/0067354 A1*   3/2018  Son .......................... H05K 1/144
(Continued)

FOREIGN PATENT DOCUMENTS

CN    106371669 A    2/2017
CN    107065336 A    8/2017
(Continued)

OTHER PUBLICATIONS

PCT International Search Report and Written Opinion, PCT/CN2019/11153, dated Dec. 30, 2019; 12 pages.

*Primary Examiner* — Douglas M Menz
(74) *Attorney, Agent, or Firm* — Fenwick & West LLP

(57) ABSTRACT

A display panel of a portable electronic device and a method for designing the same are provided. A display module includes a display panel, a drive chip and a flexible circuit board. The display panel includes a display area and a non-display area, and the drive chip corresponds to the non-display area of the display panel. The display panel is provided with an electrical connection point for connecting with the flexible circuit board, and the electrical connection point corresponds to a side of the drive chip so as to reduce a height of the non-display area of the display panel. The display panel and the method for designing the display panel are suitable for display panels of various materials, which can reduce the height of the non-display area, improve the integration of the display panel, enhance the portable performance of the electronic device, and maintain a lower manufacturing cost.

18 Claims, 3 Drawing Sheets

(51) Int. Cl.
    *H05K 1/18*          (2006.01)
    *G09G 3/3225*     (2016.01)

(52) U.S. Cl.
    CPC ............ *H01L 27/323* (2013.01); *H01L 51/56* (2013.01); *H05K 1/189* (2013.01); *H01L 2227/323* (2013.01); *H05K 2201/10128* (2013.01)

(56) References Cited

U.S. PATENT DOCUMENTS

| | | | | |
|---|---|---|---|---|
| 2019/0096979 A1* | 3/2019 | Jo | ........................ | H01L 27/3258 |
| 2019/0206898 A1* | 7/2019 | Baek | ..................... | H01L 27/124 |

FOREIGN PATENT DOCUMENTS

| | | |
|---|---|---|
| CN | 206584371 U | 10/2017 |
| CN | 207233319 U | 4/2018 |
| CN | 209071330 U | 7/2019 |

\* cited by examiner

ND DESIGN METHOD THEREFOR

DISPLAY PANEL OF PORTABLE ELECTRONIC DEVICE AND DESIGN METHOD THEREFOR

This application is a 35 U.S.C 371 Patent Application of PCT Application No. PCT/CN2019/111153, filed on Oct. 15, 2019, and entitled "DISPLAY PANEL OF PORTABLE ELECTRONIC DEVICE AND DESIGN METHOD THEREFOR" which claims the benefit of priority to Chinese patent application No. 201910071149.1, filed on Jan. 25, 2019, entitled "DISPLAY PANEL OF PORTABLE ELECTRONIC DEVICE AND DESIGN METHOD THEREFOR", the entire disclosures of which are incorporated herein by reference.

TECHNICAL FIELD

The present disclosure relates to a display panel of a portable electronic device and a method for designing the display panel.

BACKGROUND

With the rapid development of portable electronic devices, people's requirements for display panels are gradually increasing, and especially the requirements for miniaturization, low power consumption, low cost and high image quality are becoming higher and higher.

FIG. 1 is a schematic structural view of a display panel of a conventional portable electronic device. The display panel is an amorphous silicon (α-Si) panel. As shown in FIG. 1, a display module includes a display panel 10, a drive chip 40, and a flexible circuit board 50. The display panel 10 includes a display area 20 and a non-display area 30, and the drive chip 40 is disposed in the non-display area 30 of the display panel 10.

Source driving signal pins and/or touch panel signal pins 41 of the drive chip 40 are disposed on a side close to the display area 20, and connection lines between the source driving signal pins and/or the touch panel signal pins 41 and the display area 20 occupy a height D31 in the non-display area. Input and output pins 42 of the drive chip 40 are disposed on a side of the drive chip 40 far away from the display area 20. An electrical connection point 43 on the display panel 10 for connecting with the flexible circuit board 50 corresponds to a lower side of the drive chip 40, and connection lines between the input and output pins 42 and the electrical connection point 43 occupy a height D32 in the non-display area. The drive chip 40 itself has a height D32. Therefore, an overall height D30 of the non-display area is at least D31+D32+D33, generally about 4.2 mm. As people have higher and higher requirements for the integration of the display panels as well as the portable performance of the electronic devices, the size of the display area is usually getting larger and larger in order to ensure image quality. Therefore, how to effectively reduce the size of the non-display area, especially the overall height D30 of the non-display area, is a technical problem that needs to be solved at present.

At present, it is proposed to install a drive chip on a separate film on a low-temperature polysilicon (LTPS) display panel and then connect it with a flexible circuit board. Since the drive chip does not need to be disposed in the non-display area of the display panel, the height of the non-display area of the display panel can be greatly reduced. However, this method is not suitable for amorphous silicon panels, and multiplexers (MUX) are needed to reduce number of wirings. In addition, the cost of the film is high, which consequently increases the manufacturing cost of the display panel significantly.

SUMMARY

Embodiments of the present disclosure provide a display panel of a portable electronic and a method for designing the same, which can reduce the height of non-display area, improve the integration of the display panel, and enhance the portable performance of the electronic device without significantly increasing the manufacturing cost.

An embodiment of the present disclosure provides a method for designing a display panel of a portable electronic device, wherein a display module includes a display panel, a drive chip and a flexible circuit board; the display panel includes a display area and a non-display area, and the drive chip corresponds to the non-display area of the display panel; and the display panel is provided with an electrical connection point for connecting with the flexible circuit board, and the electrical connection point corresponds to a side of the drive chip so as to reduce a height of the non-display area of the display panel.

In some embodiment, input and output pins of the drive chip are disposed on the side of the drive chip or on a side of the drive chip far away from the display area of the display panel for connecting with the electrical connection point of the display panel.

In some embodiment, the input and output pins of the drive chip are disposed on the side of the drive chip, and a distance between the side of the drive chip far away from the display area of the display panel and an outer side of the non-display area of the display panel is less than 0.8 mm.

In some embodiment, number of source driving signal pins and/or touch panel signal pins on a side of the drive chip close to the display area of the display panel is reduced, so that at least 50% of the source driving signal pins and/or the touch panel signal pins of the drive chip are disposed on the side far away from the display area of the display panel, and wirings are capable of being arranged by utilizing a height of the drive chip so as to reduce a distance between the drive chip and the display area of the display panel.

In some embodiment, the source driving signal pins and/or the touch panel signal pins disposed on the side far away from the display area of the display panel are connected with the display area of the display panel from bottom to up through connection lines of the display panel, so that the height of the non-display area of the display panel is reduced by effectively utilizing a height of the connection lines.

In some embodiment, the height of the non-display area of the display panel is 1.5 mm~4.5 mm.

In some embodiment, more than 50% of source driving signal pins and/or touch panel signal pins of the drive chip are disposed on a side of the drive chip close to the display area of the display panel.

In some embodiment, the display panel is an amorphous silicon panel, a low-temperature polysilicon panel, or an active matrix organic light-emitting diode panel.

In some embodiment, the display area of the display panel is covered with a color filter glass.

Another embodiment of the present disclosure provides a display panel of a portable electronic device, wherein a display module includes a display panel, a drive chip and a flexible circuit board, the display panel includes a display area and a non-display area, and the drive chip corresponds to the non-display area of the display panel; and the display panel is provided with an electrical connection point for connecting with the flexible circuit board, and the electrical connection point corresponds to a side of the drive chip.

In some embodiment, input and output pins of the drive chip are disposed on the side of the drive chip or on a side of the drive chip far away from the display area of the display panel for connecting with the electrical connection point of the display panel.

In some embodiment, the input and output pins of the drive chip are disposed on the side of the drive chip, and a distance between the side of the drive chip far away from the display area of the display panel and an outer side of the non-display area of the display panel is less than 0.8 mm.

In some embodiment, at least 50% of source driving signal pins and/or touch panel signal pins of the drive chip are disposed on the side far away from the display area of the display panel.

In some embodiment, the source driving signal pins and/or the touch panel signal pins disposed on the side far away from the display area of the display panel are connected with the display area of the display panel from bottom to up through connection lines of the display panel.

In some embodiment, a height of the non-display area of the display panel is 1.5 mm~4.5 mm.

In some embodiment, more than 50% of source driving signal pins and/or touch panel signal pins of the drive chip are disposed on a side of the drive chip close to the display area of the display panel.

In some embodiment, the display panel is an amorphous silicon panel, a low-temperature polysilicon panel, or an active matrix organic light-emitting diode panel.

In some embodiment, the display panel further includes a color filter glass for covering the display area of the display panel.

According to the present disclosure, the display panel of the portable electronic device and the method for designing the display panel are suitable for display panels of various materials, which can reduce the height of the non-display area, improve the integration degree of the display panel, enhance the portable performance of the electronic device, and maintain a lower manufacturing cost.

DETAILED DESCRIPTION

In the following description, many specific details are set forth in order to fully understand the present disclosure. However, the present disclosure can be implemented in many other ways different from those described here. Those skilled in the art can make similar promotion without violating the connotation of the present disclosure, so the present disclosure is not limited by specific embodiments disclosed below.

Further, the present disclosure is described in detail by means of schematic views. When describing the specific embodiments of the present disclosure in detail, the schematic views only show examples for convenience of explanation, and should not be used to limit the protection scope of the present disclosure.

In order to make above objects, features and advantages of the present disclosure more obvious and understandable, the present disclosure will be described in detail below with reference to the accompanying drawings.

Figure 1:
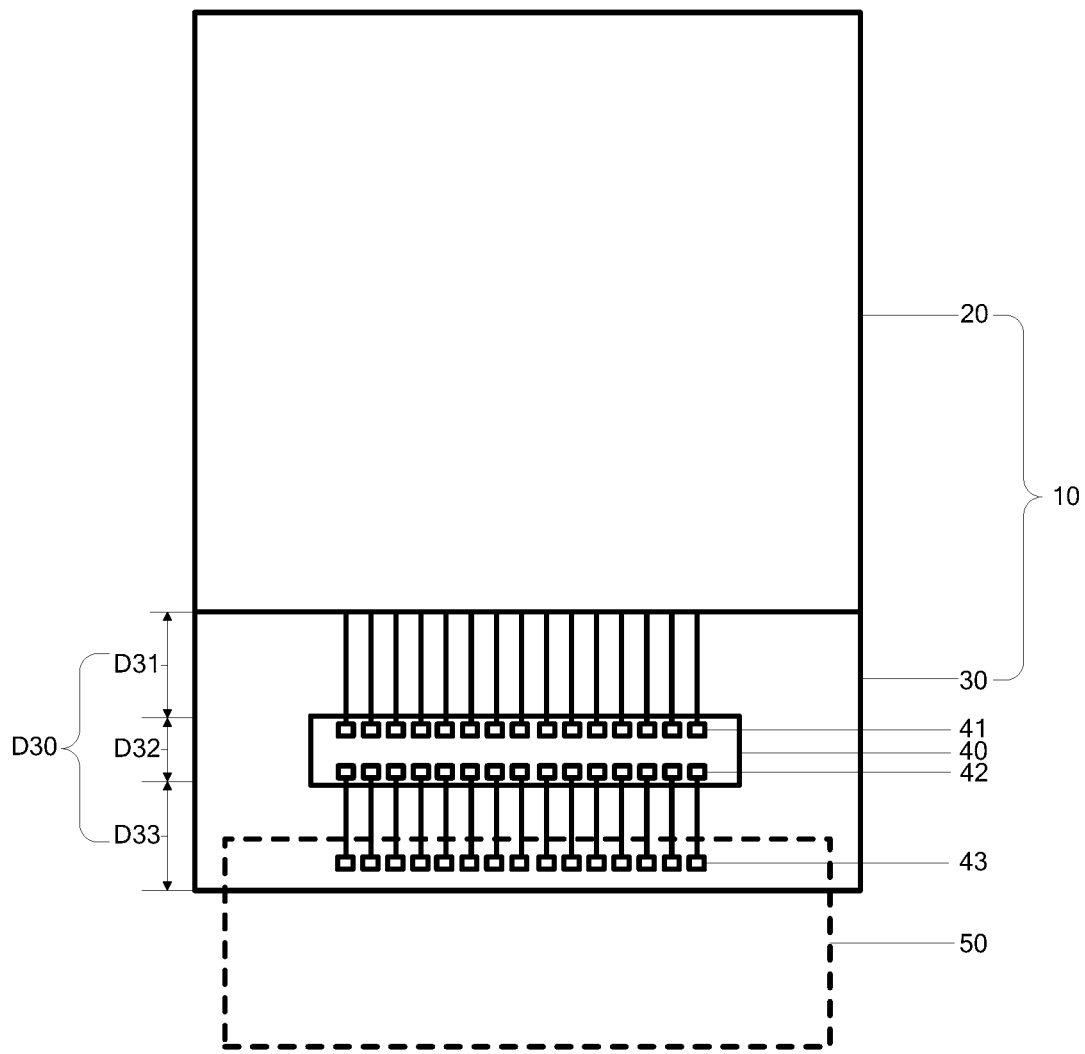
FIG. 1 is a schematic structural view of a display panel of a conventional portable electronic device.
Figure 2:
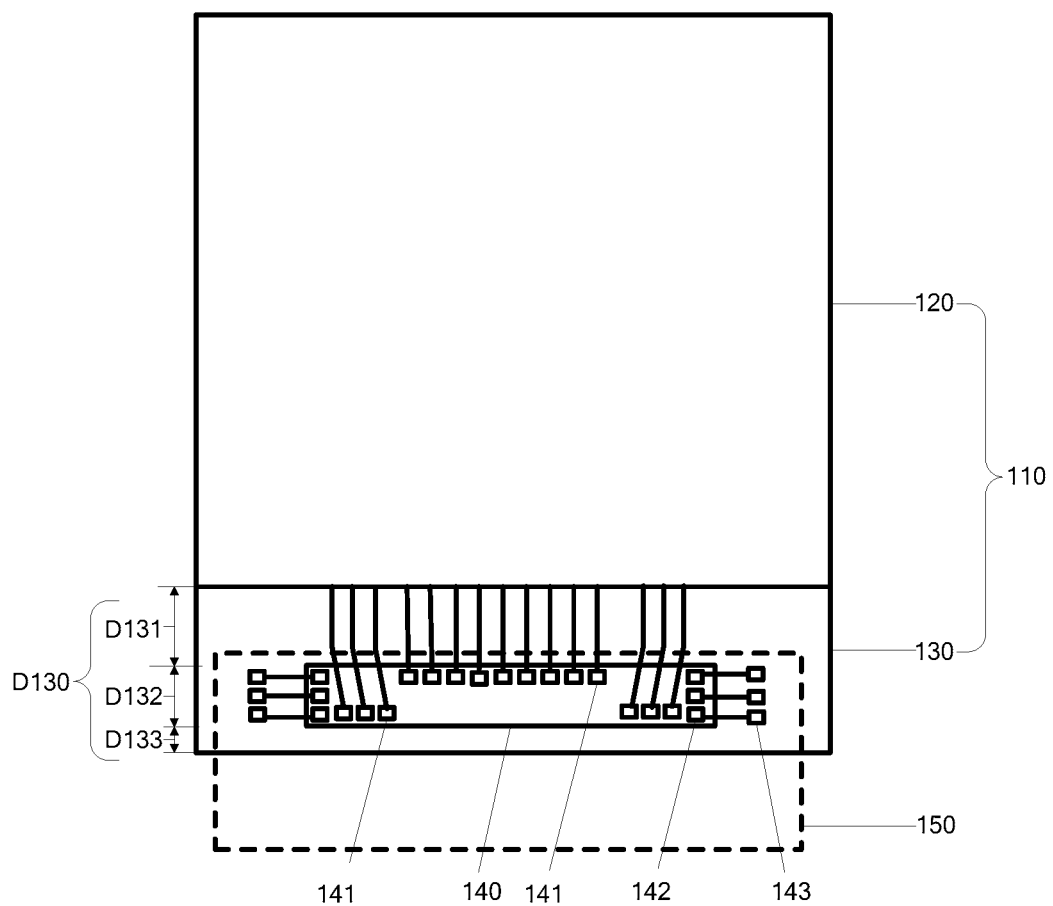
FIG. 2 is a schematic structural view of a display panel of a portable electronic device according to an embodiment of the present disclosure.

FIG. 2 is a schematic structural view of a display panel of a portable electronic device according to an embodiment of the present disclosure. The display panel may be an amorphous silicon panel, a low-temperature polysilicon panel, or an active matrix organic light emitting diode (AMOLED) panel. As shown in FIG. 2, a display module includes a display panel 110, a drive chip 140, and a flexible circuit board 150. The display panel 110 includes a display area 120 and a non-display area 130. The drive chip 140 corresponds to the non-display area 130 of the display panel 110.

Wherein, the display panel 110 is provided with electrical connection points 143 for connecting with the flexible circuit board 150. The electrical connection points 143 correspond to a side of the drive chip 140, that is, correspond to both a left side of the drive chip 140 and a right side of the drive chip 140 or at least one of the left side or the right side of the drive chip 140, so as to reduce a height in the non-display area occupied by connection lines between input and output pins 142 of the drive chip 140 and the electrical connection points 143, thereby reducing an overall height D130 of the non-display area 130, and improving the integration of the display panel.

In the embodiment as shown in FIG. 2, the input and output pins 142 of the drive chip 140 are correspondingly disposed on the side of the drive chip 140 for connecting with the electrical connection points 143. By disposing the input and output pins 142 of the drive chip 140 on the side of the drive chip 140, a distance D133 between a side of the drive chip 140 far away from the display area 120 and an outer side of the non-display area 130 is less than 0.8 mm. Those skilled in the art may understand that the input and output pins 142 of the drive chip 140 may also be disposed on the side far away from the display area 120 and connected with the electrical connection points 143 through connection lines of the display panel 110 from bottom to top.

In the embodiment as shown in FIG. 2, since the input and output pins 142 of the drive chip 140 are disposed on the side of the drive chip 140, some of the source driving signal pins and/or the touch panel signal pins 141 may be disposed on the side far away from the display area 120, and wirings may be arranged by utilizing the height of the drive chip 140, thereby reducing a distance D131 from the drive chip 140 to the display area 120, and further reducing the overall height D130 of the non-display area 130 and improving the integration of the display panel. In some embodiment, more than 50% of the source driving signal pins and/or the touch panel signal pins 141 are disposed on the side close to the display area 120.

Figure 3:
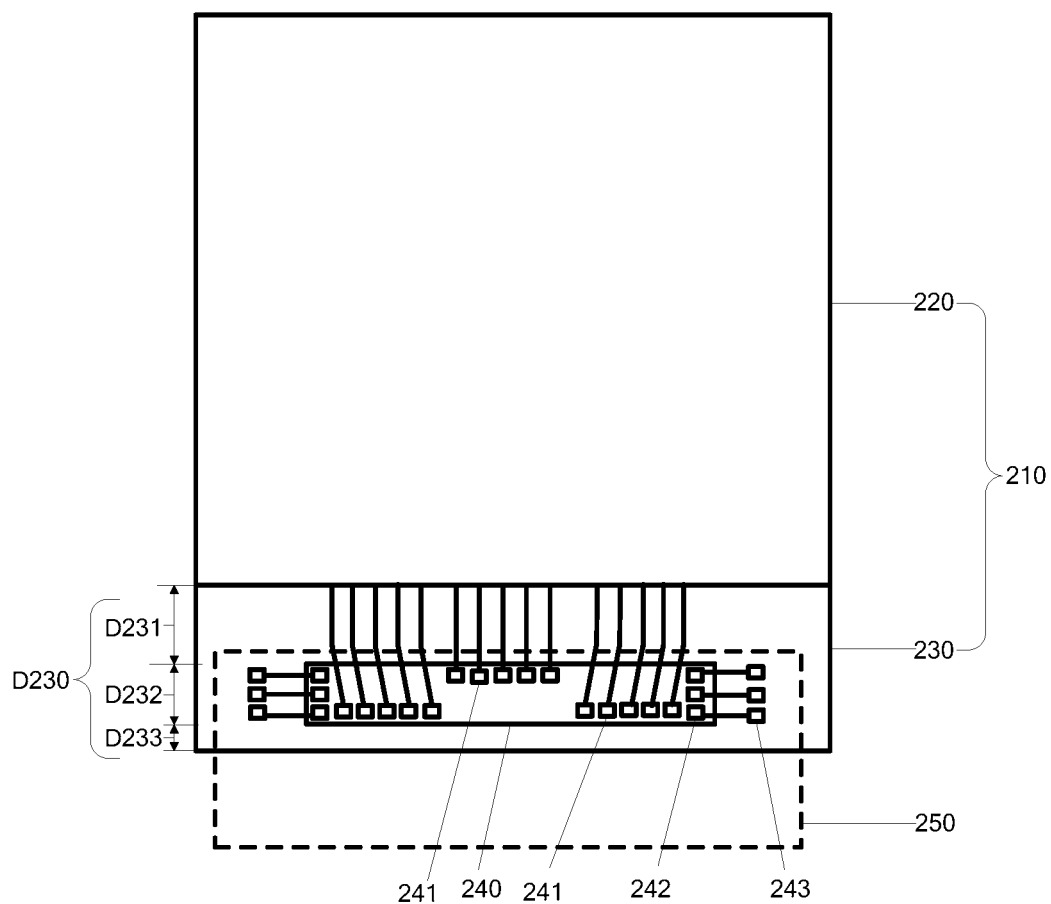
FIG. 3 is a schematic structural view of a display panel of a portable electronic device according to another embodiment of the present disclosure.

In another embodiment as shown in FIG. 3, number of source driving signal pins and/or touch panel signal pins 241 on a side of a drive chip 240 close to a display area 220 is further reduced, so that more than 50% of the source driving signal pins and/or the touch panel signal pins 241 are disposed on a side far away from the display area 220, so as to reduce a distance D231 from the drive chip 240 to the display area 220, and make full use of an effective space of wirings. The source driving signal pins and/or the touch panel signal pins 241 disposed on the side far away from the display area 220 are connected with the display area 220 through connection lines of a display panel 210 from bottom to top, which can effectively utilize a height of the connection lines. Input and output pins 242 of the drive chip 240 are disposed on a side of the drive chip, so that a distance D233 between the side of the drive chip 240 far away from the display area 220 and an outer side of the non-display area 230 is less than 0.8 mm, thereby reducing an overall height D230 of the non-display area 230 to 1.5 mm~4.5 mm.

In addition, the method for designing the display panel of the portable electronic device of the present disclosure further includes: covering the display area 120, 220 with a color filter glass (not shown).

Another embodiment of the present disclosure also provides a display panel of a portable electronic device. A display module includes a display panel 110, a drive chip 140, and a flexible circuit board 150. The display panel 110 includes a display area 120 and a non-display area 130, and the drive chip 140 corresponds to the non-display area 130 of the display panel 110. The display panel 110 is provided with electrical connection points 143 for connecting with the flexible circuit board 150, and the electrical connection points 143 correspond to a side of the drive chip 140, that is, correspond to left and right sides or at least one side of the drive chip 140.

In the embodiment as shown in FIG. 2, the input and output pins 142 of the drive chip 140 are disposed on the side of the drive chip 140 or the side far away from the display area 120, and are used to connect with the electrical connection points 143 of the display panel 110.

In some embodiment, the input and output pins 142 of the drive chip 140 are disposed on the side of the drive chip 140, and the distance D133 between the side of the drive chip far away from the display area 120 and the outer side of the non-display area 130 is less than 0.8 mm.

In another embodiment as shown in FIG. 3, at least 50% of the source driving signal pins and/or the touch panel signal pins 241 of the drive chip 240 are disposed on the side far away from the display area 220.

In some embodiment, the source driving signal pins and/or the touch panel signal pins 241 disposed on the side far away from the display area 220 are connected with the display area 220 through the connection lines of the display panel 210 from bottom to top.

In some embodiment, the height D230 of the non-display area 230 is 1.5 mm~4.5 mm.

In some embodiment, the display panels 110, 210 are amorphous silicon panels, low-temperature polysilicon panels, or active matrix organic light-emitting diode panels.

In some embodiment, the display panels 110, 210 further includes: a color filter glass for covering the display areas 120, 220.

According to the present disclosure, the display panel of the portable electronic device and the method for designing the same are suitable for display panels of various materials, which can reduce the height of the non-display area, improve the integration of the display panel, enhance the portable performance of the electronic device, and maintain a lower manufacturing cost.

Although the present disclosure has been disclosed above with specific embodiments, the present disclosure is not limited to this. Any person skilled in the art can make possible changes and modifications to the technical solution of the present disclosure by applying the methods and technical contents disclosed above without departing from the spirit and scope of the present disclosure. Any simple modification, equivalent change and modification to the above embodiments according to the technical essence of the present disclosure without departing from the technical solutions of the present disclosure shall fall within the protection scope of the present disclosure.

The invention claimed is:

1. A method for designing a display panel of a portable electronic device, wherein a display module comprises a display panel, a drive chip and a flexible circuit board;

the display panel comprises a display area and a non-display area, and the drive chip corresponds to the non-display area of the display panel; and the display panel is provided with an electrical connection point for connecting with the flexible circuit board, and the electrical connection point corresponds to a side of the drive chip so as to reduce a height of the non-display area of the display panel.

2. The method for designing a display panel of a portable electronic device according to claim 1, wherein input and output pins of the drive chip are disposed on the side of the drive chip or on a side of the drive chip far away from the display area of the display panel for connecting with the electrical connection point of the display panel.

3. The method for designing a display panel of a portable electronic device according to claim 2, wherein the input and output pins of the drive chip are disposed on the side of the drive chip, and a distance between the side of the drive chip far away from the display area of the display panel and an outer side of the non-display area of the display panel is less than 0.8 mm.

4. The method for designing a display panel of a portable electronic device according to claim 2, wherein number of source driving signal pins and/or touch panel signal pins on a side of the drive chip close to the display area of the display panel is reduced, so that at least 50% of the source driving signal pins and/or the touch panel signal pins of the drive chip are disposed on the side far away from the display area of the display panel, and wirings are capable of being arranged by utilizing a height of the drive chip so as to reduce a distance between the drive chip and the display area of the display panel.

5. The method for designing a display panel of a portable electronic device according to claim 4, wherein the source driving signal pins and/or the touch panel signal pins disposed on the side far away from the display area of the display panel are connected with the display area of the display panel from bottom to up through connection lines of the display panel, so that the height of the non-display area of the display panel is reduced by effectively utilizing a height of the connection lines.

6. The method for designing a display panel of a portable electronic device according to claim 4, wherein the height of the non-display area of the display panel is 1.5 mm~4.5 mm.

7. The method for designing a display panel of a portable electronic device according to claim 2, wherein more than 50% of source driving signal pins and/or touch panel signal pins of the drive chip are disposed on a side of the drive chip close to the display area of the display panel.

8. The method for designing a display panel of a portable electronic device according to claim 2, wherein the display panel is an amorphous silicon panel, a low-temperature polysilicon panel, or an active matrix organic light-emitting diode panel.

9. The method for designing a display panel of a portable electronic device according to claim 2, wherein the display area of the display panel is covered with a color filter glass.

10. A display panel of a portable electronic device, wherein a display module comprises a display panel, a drive chip and a flexible circuit board, the display panel comprises a display area and a non-display area, and the drive chip corresponds to the non-display area of the display panel; and the display panel is provided with an electrical connection point for connecting with the flexible circuit board, and the electrical connection point corresponds to a side of the drive chip.

11. The display panel of a portable electronic device according to claim 10, wherein input and output pins of the drive chip are disposed on the side of the drive chip or on a side of the drive chip far away from the display area of the display panel for connecting with the electrical connection point of the display panel.

12. The display panel of a portable electronic device according to claim 11, wherein the input and output pins of the drive chip are disposed on the side of the drive chip, and a distance between the side of the drive chip far away from the display area of the display panel and an outer side of the non-display area of the display panel is less than 0.8 mm.

13. The display panel of a portable electronic device according to claim 11, wherein at least 50% of source driving signal pins and/or touch panel signal pins of the drive chip are disposed on the side far away from the display area of the display panel.

14. The display panel of a portable electronic device according to claim 13, wherein the source driving signal pins and/or the touch panel signal pins disposed on the side far away from the display area of the display panel are connected with the display area of the display panel from bottom to up through connection lines of the display panel.

15. The display panel of a portable electronic device according to claim 13, wherein a height of the non-display area of the display panel is 1.5 mm~4.5 mm.

16. The display panel of a portable electronic device according to claim 11, wherein more than 50% of source driving signal pins and/or touch panel signal pins of the drive chip are disposed on a side of the drive chip close to the display area of the display panel.

17. The display panel of a portable electronic device according to claim 10, wherein the display panel is an amorphous silicon panel, a low-temperature polysilicon panel, or an active matrix organic light-emitting diode panel.

18. The display panel of a portable electronic device according to claim 10, further comprising a color filter glass for covering the display area of the display panel.

* * * * *